(12) United States Patent
Lu

(10) Patent No.: US 11,984,472 B2
(45) Date of Patent: May 14, 2024

(54) DOUBLE-SIDED CAPACITOR STRUCTURE AND METHOD FOR FORMING THE SAME

(71) Applicant: CHANGXIN MEMORY TECHNOLOGIES, INC., Hefei (CN)

(72) Inventor: Yong Lu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 393 days.

(21) Appl. No.: 17/373,904

(22) Filed: Jul. 13, 2021

(65) Prior Publication Data

US 2021/0343833 A1 Nov. 4, 2021

Related U.S. Application Data

(63) Continuation of application No. PCT/CN2021/075945, filed on Feb. 8, 2021.

(30) Foreign Application Priority Data

Feb. 27, 2020 (CN) .......................... 202010123241.0

(51) Int. Cl.
*H01L 49/02* (2006.01)
(52) U.S. Cl.
CPC .................................. *H01L 28/91* (2013.01)
(58) Field of Classification Search
CPC ......... H01L 28/91; H01L 28/40; H01L 28/60; H01L 23/64; H10B 12/00
See application file for complete search history.

(56) References Cited

U.S. PATENT DOCUMENTS

| 7,105,403 B2 | 9/2006 | Graettinger |
| 7,683,413 B2 | 3/2010 | Graettinger |
| 2005/0026361 A1 | 2/2005 | Graettinger |
| 2007/0001207 A1 | 1/2007 | Graettinger |
| 2021/0050409 A1* | 2/2021 | Rocklein ........... H01L 21/28568 |

FOREIGN PATENT DOCUMENTS

| CN | 108447864 A | 8/2018 |
| CN | 108717936 A | 10/2018 |
| CN | 109065501 A | 12/2018 |
| CN | 109148426 A | 1/2019 |

OTHER PUBLICATIONS

International Search Report in the international application No. PCT/CN2021/075945, dated May 13, 2021, 2 pgs.

* cited by examiner

*Primary Examiner* — Christine A Enad
(74) *Attorney, Agent, or Firm* — Cooper Legal Group, LLC

(57) ABSTRACT

A double-sided capacitor structure and a method for forming the same are provided. The method includes: providing a base including a substrate, capacitor contacts in the substrate, a stacked structure on a surface of the substrate, and capacitor holes penetrating through the stacked structure and exposing the capacitor contacts, and the stacked structure includes sacrificial layers and supporting layers which are alternately stacked in a direction perpendicular to the substrate; forming a first electrode layer, a first dielectric layer and a second electrode layer on inner walls of the capacitor holes; filling the capacitor holes with a first conductive material to form a first conductive filling layer; completely removing several of the sacrificial layers and/or the supporting layers to remain at least two of the supporting layers; and forming a second dielectric layer and a third electrode layer that covers a surface of the second dielectric layer.

12 Claims, 5 Drawing Sheets

DOUBLE-SIDED CAPACITOR STRUCTURE AND METHOD FOR FORMING THE SAME

CROSS-REFERENCE TO RELATED APPLICATIONS

The present application is a U.S. continuation application of International Application No. PCT/CN2021/075945, filed on Feb. 8, 2021, which claims priority to Chinese Patent Application No. 202010123241.0, filed on Feb. 27, 2020. International Application No. PCT/CN2021/075945 and Chinese Patent Application No. 202010123241.0 are incorporated herein by reference in their entireties.

TECHNICAL FIELD

The present application relates to the technical field of semiconductor manufacture, and more particularly, to a double-sided capacitor structure and a method for forming the same.

BACKGROUND

A Dynamic Random Access Memory (DRAM) is a common semiconductor structure in electronic devices such as computers. It is composed of a plurality of memory cells. Each memory cell includes a transistor and a capacitor. A gate of the transistor is electrically connected to a word line, a source is electrically connected to a bit line, and a drain is electrically connected to the capacitor. A word line voltage on the word line can control turning on and turning off of the transistor, so that data information stored in the capacitor can be read out from or written into the capacitor through the bit line.

Along with the miniaturization of a size of a semiconductor device, the lateral area thereof on a substrate is reduced. By means of increasing a height of a bottom electrode or reducing a thickness of the bottom electrode, the capacitance value of the capacitor can be increased or an enough high capacitance value of the capacitor can be maintained. However, increasing the height of the bottom electrode or reducing the thickness of the bottom electrode will result in a higher aspect ratio and a thinner thickness of the bottom electrode, which will affect the performance reliability of a capacitor array region. For example, collapse or overturning of the bottom electrode may be caused, resulting in a short circuit of adjacent bottom electrodes.

By means of adding a lateral continuous supporting layer of the electrode, the stability of the bottom electrode can be improved. However, a single lateral supporting layer has its height limit, so that the capacitance value of the capacitor is limited by the height of the electrode, and the risk of overturning and collapse of electrodes still exists.

Therefore, how to solve the problem of lateral instability of the capacitor array region, reduce the risk of collapse or overturning of the bottom electrode, and improve the performance stability of the semiconductor devices is a technical problem to be solved urgently at present.

SUMMARY

The present application provides a double-sided capacitor structure and a method for forming the same to solve the problem of poor lateral stability of a capacitor array region and improve the performance stability of a semiconductor device.

In order to solve the above-mentioned problem, the present application provides a method for forming a double-sided capacitor structure, including the following steps:

providing a base, the base includes a substrate, capacitor contacts in the substrate, a stacked structure on a surface of the substrate, and capacitor holes penetrating through the stacked structure and exposing the capacitor contacts, and the stacked structure includes sacrificial layers and supporting layers which are alternately stacked in a direction perpendicular to the substrate;

forming a first electrode layer, a first dielectric layer and a second electrode layer which are stacked in a radial direction of the capacitor holes in sequence on inner walls of the capacitor holes;

filling the capacitor holes with a first conductive material to form a first conductive filling layer;

completely removing several of the sacrificial layers and/or the supporting layers from a top surface of the stacked structure to remain at least two of the supporting layers; and forming a second dielectric layer that covers a surface of the second electrode layer and a top surface of the first conductive filling layer, and a third electrode layer that covers a surface of the second dielectric layer, to form the double-sided capacitor structure.

Optionally, the filling the capacitor holes with the conductive material may include specific steps:

depositing the first conductive material in the capacitor holes and on the top surface of the stacked structure; and removing the conductive material on the top surface of the stacked structure.

Optionally, the stacked structure may include a first supporting layer, a first sacrificial layer, a second supporting layer, a second sacrificial layer, and a third supporting layer which are stacked in sequence in the direction perpendicular to the substrate. the completely removing several of the sacrificial layers and/or the supporting layers from a top surface of the stacked structure may include specific steps:

removing the second electrode layer, the first dielectric layer and the first electrode layer that cover the top surface of the stacked structure to expose the third supporting layer;

removing the third supporting layer to expose the second sacrificial layer; and removing the second sacrificial layer.

Optionally, the forming a second dielectric layer that covers a surface of the second electrode layer and a top surface of the first conductive filling layer, and a third electrode layer that covers a surface of the second dielectric layer may include specific steps:

forming the second dielectric layer that covers the surface of the second electrode layer and the top surface of the first conductive filling layer and an exposed surface of the second supporting layer, and the third electrode layer that covers the surface of the second dielectric layer.

Optionally, after the double-sided capacitor structure is formed, the method may further include the following steps:

depositing a second conductive material on the surface of the third electrode layer to form a second conductive filling layer.

Optionally, both the first conductive material and the second conductive material are a polycrystalline silicon material.

In order to solve the above-mentioned problem, the present application further provides a double-sided capacitor structure including:

a base, the base includes a substrate, capacitor contacts in the substrate, a stacked structure on a surface of the substrate, and capacitor holes penetrating through the stacked structure and exposing the capacitor contacts, and the stacked structure includes sacrificial layers and supporting layers which are alternately stacked in a direction perpendicular to the substrate, and the number of the supporting layers is at least two;

a first electrode layer that covers inner walls of the capacitor holes and extends out of the stacked structure in the direction perpendicular to the substrate;

a first dielectric layer that covers a top surface and a bottom surface of the first electrode layer and a side wall surface of the first electrode layer facing the capacitor holes;

a second electrode layer that covers a top surface and a bottom surface of the first dielectric layer and a side wall surface of the first dielectric layer facing the capacitor holes;

a first conductive filling layer that is filled in a region enclosed by the second electrode layer;

a second dielectric layer that covers the surface of the second electrode layer and the surface of the first conductive filling layer; and a third electrode layer that covers the surface of the second dielectric layer.

Optionally, the top surface of the first conductive filling layer may be flush with the top surface of the second electrode layer.

Optionally, the second dielectric layer may also cover the surface of the supporting layer as the top layer of the stacked structure.

Optionally, the stacked structure may include a first supporting layer on the surface of the substrate, a first sacrificial layer covering the surface of the first supporting layer, and a second supporting layer covering the surface of the first sacrificial layer;

the second dielectric layer covers the surface of the second supporting layer facing away from the first sacrificial layer.

Optionally, the double-sided capacitor structure may further include:

a second conductive filling layer that covers the surface of the third electrode layer.

Optionally, a material of both the first conductive filling layer and the second conductive filling layer may be a polycrystalline silicon material.

According to the double-sided capacitor structure and the method for forming the same provided by the present application, on the one hand, the region enclosed by the second electrode layer in the capacitor hole is filled with the first conductive filling layer to support the first electrode layer and the second electrode layer, which reduces and even avoids the risk of electrode collapse and overturning; and on the other hand, at least two of the supporting layers and the sacrificial layer between the remained supporting layers are remained, which further improves the lateral stability of a capacitor array region and is beneficial to increasing the overall height of the electrode layer, thereby further increasing the capacitance value of the capacitor.

DETAILED DESCRIPTION

Examples of a double-sided capacitor structure and a method for forming the same provided by the present application are described in detail below in combination with accompanying drawings.

Figure 1:
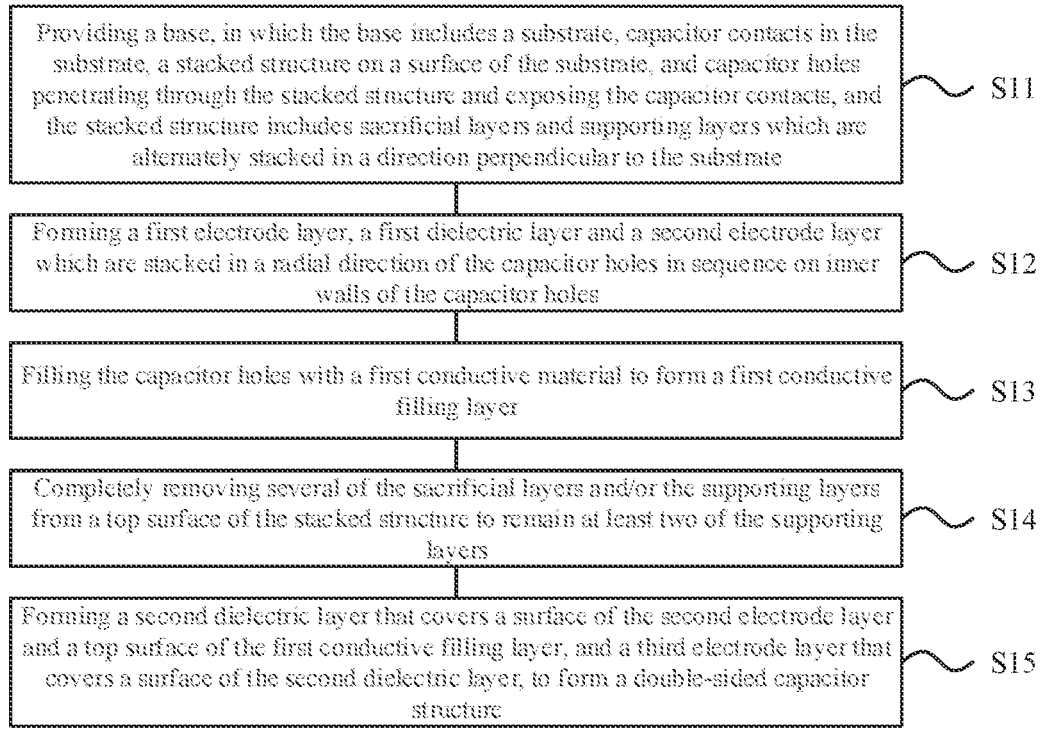
FIG. 1 is a flowchart of a method for forming a double-sided capacitor structure according to an example of the present application.

An example provides a method for forming a double-sided capacitor structure. FIG. 1 is a flowchart of a method for forming a double-sided capacitor structure according to the example of the present application. FIG. 2A to FIG. 2I are schematic cross-sectional views of main processes during forming a double-sided capacitor structure according to examples of the present application. The double-sided capacitor structure formed in the examples can be applied to a Dynamic Random Access Memory (DRAM), but it is not limited to that. As shown in FIG. 1 and FIG. 2A to FIG. 2I, the method for forming a double-sided capacitor structure provided in the examples includes the following steps:

At step S11, providing a base. The base includes a substrate, capacitor contacts 20 in the substrate, a stacked structure 21 on a surface of the substrate, and capacitor holes 22 penetrating through the stacked structure 21 and exposing the capacitor contacts 20. The stacked structure 21 includes sacrificial layers and supporting layers which are alternately stacked in a direction perpendicular to the substrate, as shown in FIG. 2A.

Specifically, a plurality of active regions are arranged in an array inside the substrate, and the capacitor contacts 20 are located in the active regions. A material of each capacitor contact 20 may be, but is not limited to, tungsten. A plurality of the sacrificial layers and the supporting layers are alternately stacked in the direction perpendicular to the substrate. The number of the sacrificial layers and the supporting layers which are alternately stacked may be selected by those skilled in the art according to an actual need. In the present example, in the stacked structure, the number of the supporting layers may be at least 3, and the number of the sacrificial layers may be at least 2, so as to improve the lateral stability of a capacitor array region. A material of the sacrificial layers may be, but is not limited to, an oxide material, such as silicon dioxide. A material of the supporting layers can be, but is not limited to, a nitride material, such as silicon nitride.

Figure 2A:
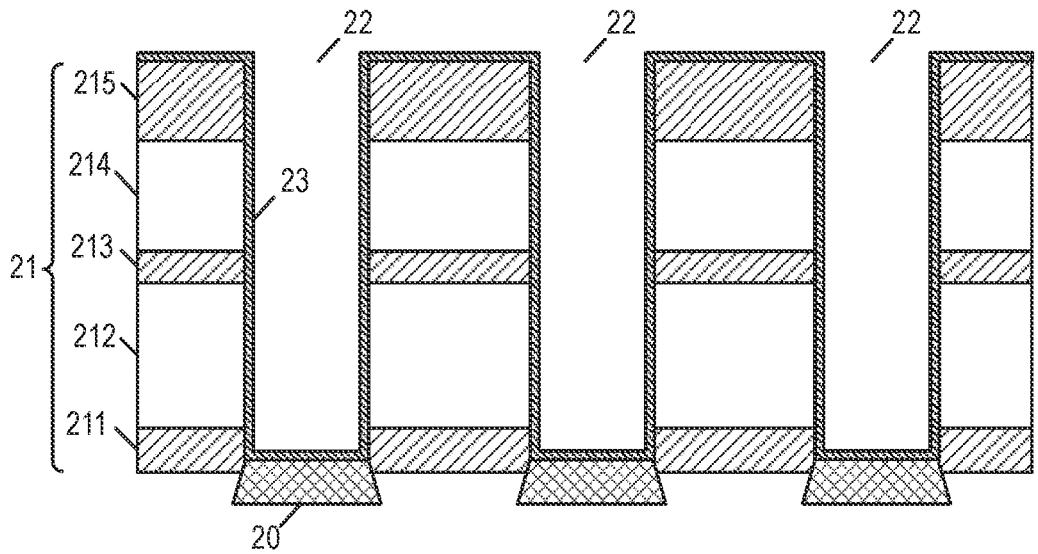
FIG. 2A to FIG. 2I are schematic cross-sectional views of main processes during forming a double-sided capacitor structure according to the example of the present application.
Figure 2B:
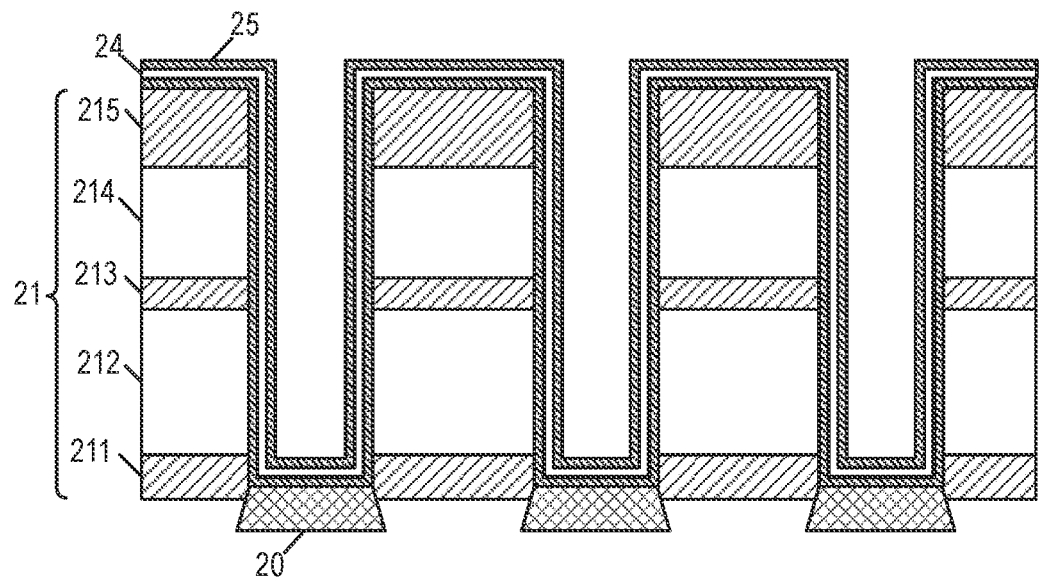

At step S12, forming a first electrode layer 23, a first dielectric layer 24 and a second electrode layer 25 which are stacked in a radial direction of the capacitor holes 22 in sequence on the inner walls of the capacitor holes 22, as shown in FIG. 2A and FIG. 2B.

Specifically, after the capacitor holes 22 are formed, a material such as titanium nitride is deposited on the inner walls of the capacitor holes 22 and a top surface (i.e., a surface of the stacked structure facing away from the substrate) of the stacked structure 21 to form the first electrode layer 23, as shown in FIG. 2A. Then, a dielectric material with a high dielectric constant is deposited on a surface of the first electrode layer 23 to form the first dielectric layer 24. Next, a material such as titanium nitride is deposited on a surface of the first dielectric layer 24 to form the second electrode layer 25, as shown in FIG. 2B.

Figure 2C:
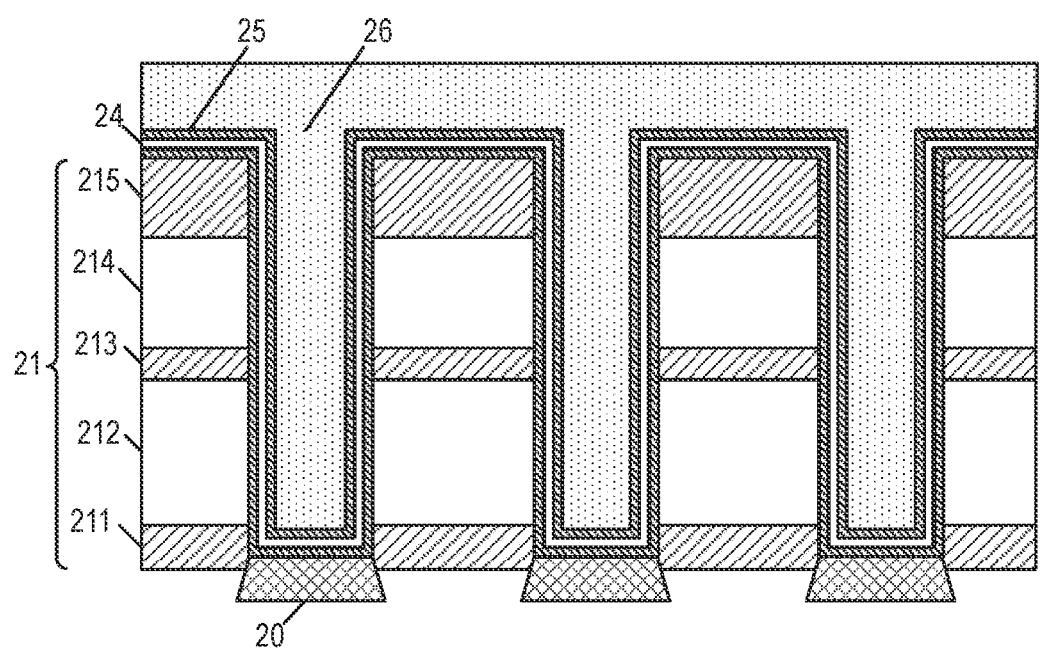

At step S13, filling the capacitor holes 22 with a first conductive material to form a first conductive filling layer 26, as shown in FIG. 2C.

Optionally, the filling the capacitor holes 22 with a first conductive material includes specific steps:

the first conductive material is deposited in the capacitor holes 22 and on the top surface of the stacked structure 21; and the conductive material on the top surface of the stacked structure 21 is removed.

Specifically, the first conductive material may be deposited in the capacitor holes 22 by using a chemical vapor deposition process, a physical vapor deposition process or an atomic layer deposition process to fully fill the capacitor holes 22 (i.e., the region enclosed by the second electrode layer 25 in the capacitor holes 22) and cover the second electrode layer 25 on the surface of the stacked structure 21, as shown in FIG. 2C. The first conductive material may be a metal material or a polycrystalline silicon material. Those skilled in the art may select the material according to an actual need.

Figure 2D:
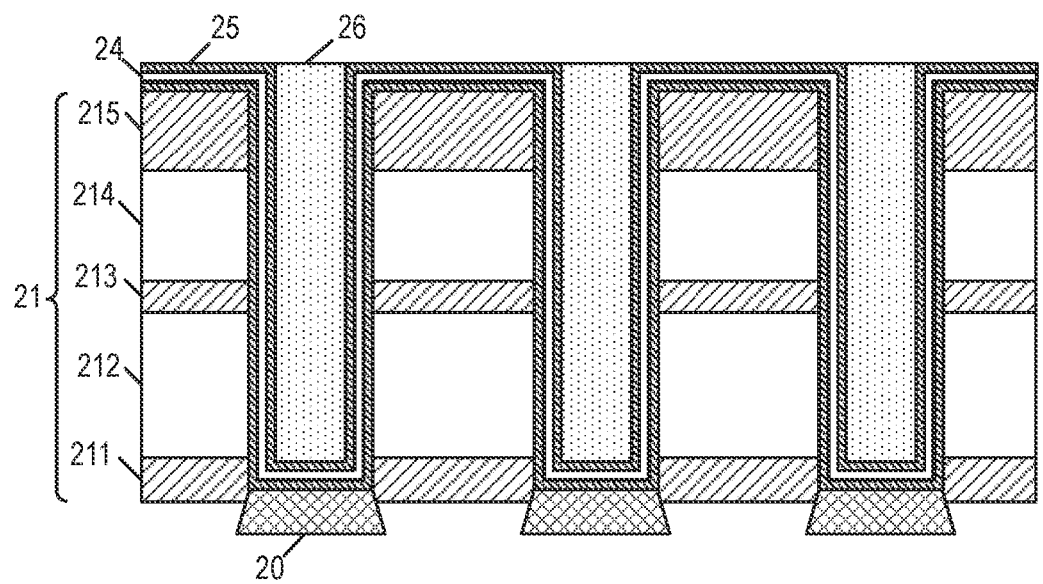
Figure 2E:
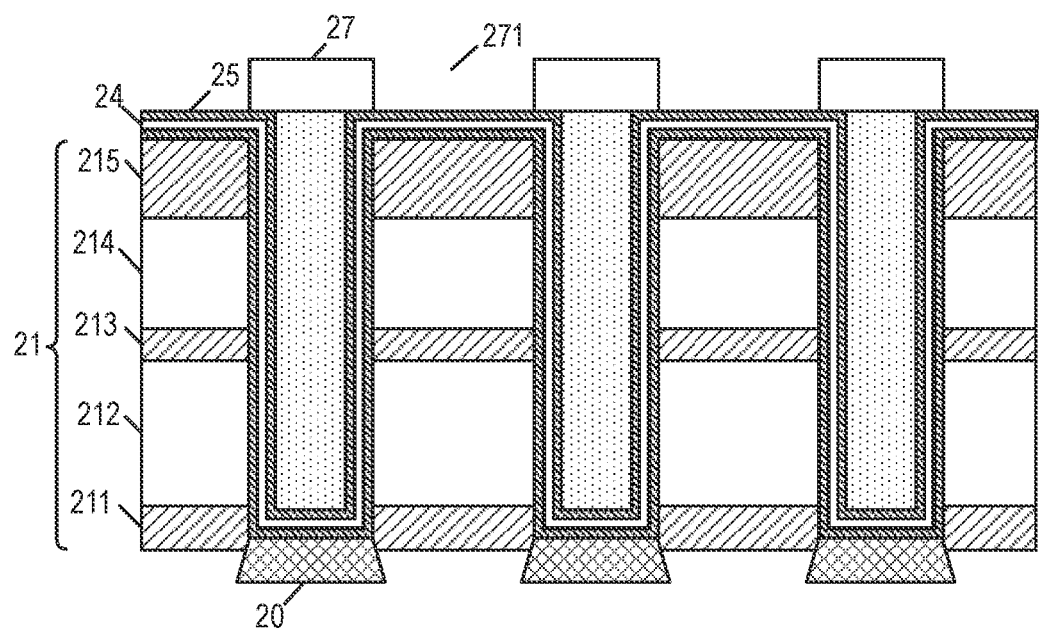
Figure 2F:
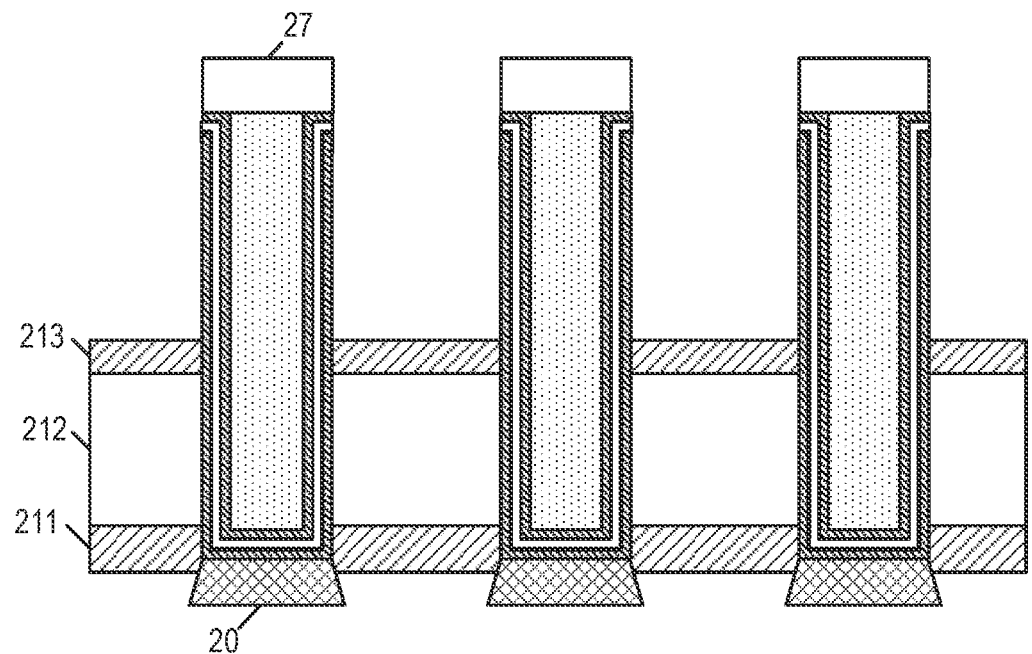
Figure 2G:
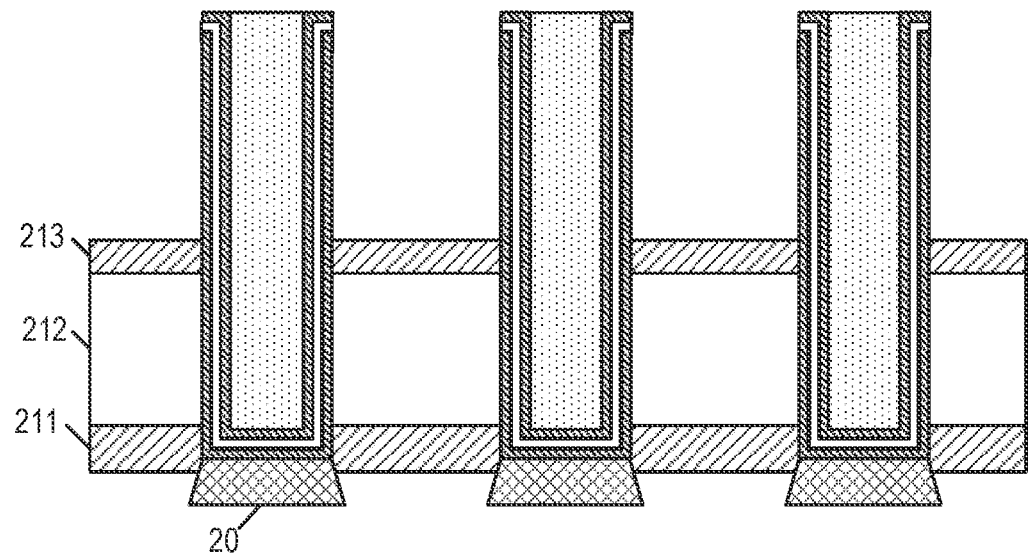

At step S14, completely removing several of the sacrificial layers and/or the supporting layers from the top surface of the stacked structure 21 to remain at least two of the supporting layers, as shown in FIG. 2G.

Optionally, the stacked structure 21 includes a first supporting layer 211, a first sacrificial layer 212, a second supporting layer 213, a second sacrificial layer 214, and a third supporting layer 215, which are stacked in sequence in the direction perpendicular to the substrate. The completely removing several of the sacrificial layers and/or supporting layers from the top surface of the stacked structure 21 includes specific steps:

the second electrode layer 25, the first dielectric layer 24 and the first electrode layer 23 that cover the top surface of the stacked structure 21 are removed to expose the third supporting layer 215; and the third supporting layer 215 is removed to expose the second sacrificial layer 214; and the second sacrificial layer 214 is removed.

For example, the first supporting layer 211, the first sacrificial layer 212, the second supporting layer 213, the second sacrificial layer 214, and the third supporting layer 215 are stacked in sequence in a direction from the substrate to the stacked structure 21. After the structure as shown in FIG. 2C is formed, the second electrode layer 25 is used as an etching cut-off layer; the first conductive filling layer 26 that covers the surface of the second electrode layer 25 is removed, and only the first conductive filling layer 26 in the capacitor holes 22 is remained, such that the top surface of the remained first conductive filling layer 26 is flush with the top surface of the second electrode layer 25. The structure obtained thereby is shown in FIG. 2D. Then, photoresist layers 27 are formed on the surface of the first conductive filling layer 26. An opening 271 that exposes the second electrode layer 25 is provided between adjacent photoresist layers 27, as shown in FIG. 2E. Then, a dry etching process or a wet etching process is used to etch the second electrode layer 25, the first dielectric layer 24, and the first electrode layer 23 in sequence from the openings 271 to expose the third supporting layer 215. Next, the third supporting layer 215 and the second sacrificial layer 214 are etched in sequence to expose the second supporting layer 213, as shown in FIG. 2F. After the photoresist layers 27 are removed, the structure as shown in FIG. 2G is obtained. The above description is only for illustration. In practice, four or more sacrificial layers may be formed by those skilled in the art. In the etching process, three or four of the supporting layers may be remained by those skilled in the art according to an actual need. By appropriately designing the thicknesses of the third supporting layer 215 and the second sacrificial layer 214, the height of the first electrode layer 23 extending out of the second supporting layer 213 after the third supporting layer 215 and the second sacrificial layer 214 are removed can be flexibly adjusted.

At the step of removing several of the sacrificial layers and/or the supporting layers, since the capacitor holes 22 are filled with the first conductive filling layer 26, the lateral stability of the first electrode layer 23, the first dielectric layer 24, and the second electrode layer 25 is enhanced, and collapse or overturning of the first electrode layer 23, the first dielectric layer 24, and the second electrode layer 25 can be effectively avoided. Furthermore, not all of the sacrificial layers and supporting layers are removed at this step, and at least two of the supporting layers and the sacrificial layer between two adjacent layers of remained supporting layers are remained, so that restriction of a height limit of the supporting layer to the height of the first electrode layer 23 is reduced, and the height of the first electrode layer 23 can be further increased, thereby contributing to further increasing the capacitance value of the double-sided capacitor structure.

Figure 2H:
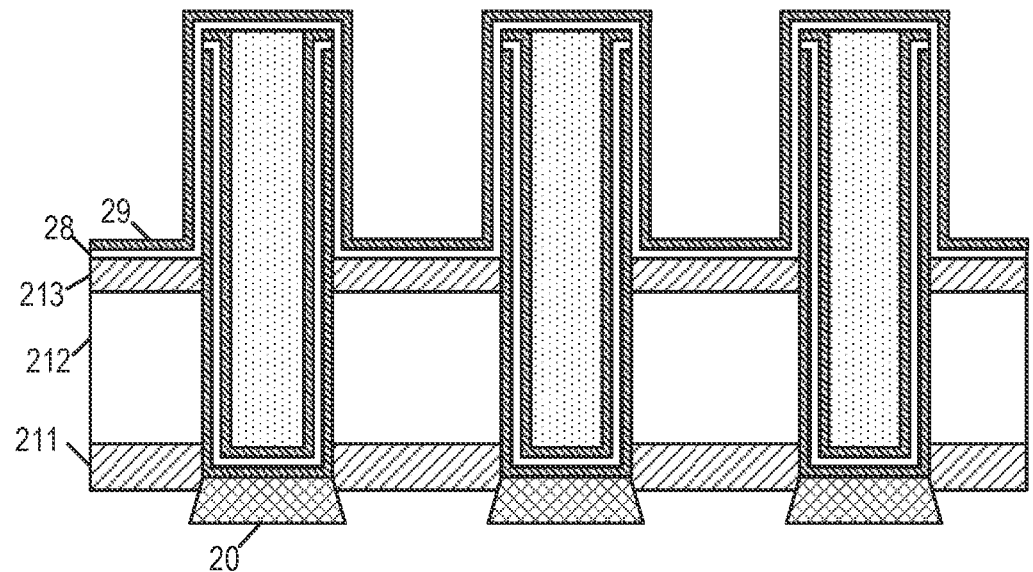

At step S15, forming a second dielectric layer 28 that covers a surface of the second electrode layer 25 and a top surface of the first conductive filling layer 26, and a third electrode layer 29 that covers a surface of the second dielectric layer 28, to form the double-sided capacitor structure, as shown in FIG. 2H.

Optionally, the forming a second dielectric layer 28 that covers a surface of the second electrode layer 25 and a top surface of the first conductive filling layer 26, and a third electrode layer 29 that covers a surface of the second dielectric layer 28 includes specific steps:

a second dielectric layer 28 that covers the surface of the second electrode layer 25 and the top surface of the first conductive filling layer 26 and an exposed surface of the second supporting layer 213 is formed, and a third electrode layer 29 that covers the surface of the second dielectric layer 28 is formed.

Optionally, both the first conductive material and the second conductive material are a polycrystalline silicon material.

Figure 2I:
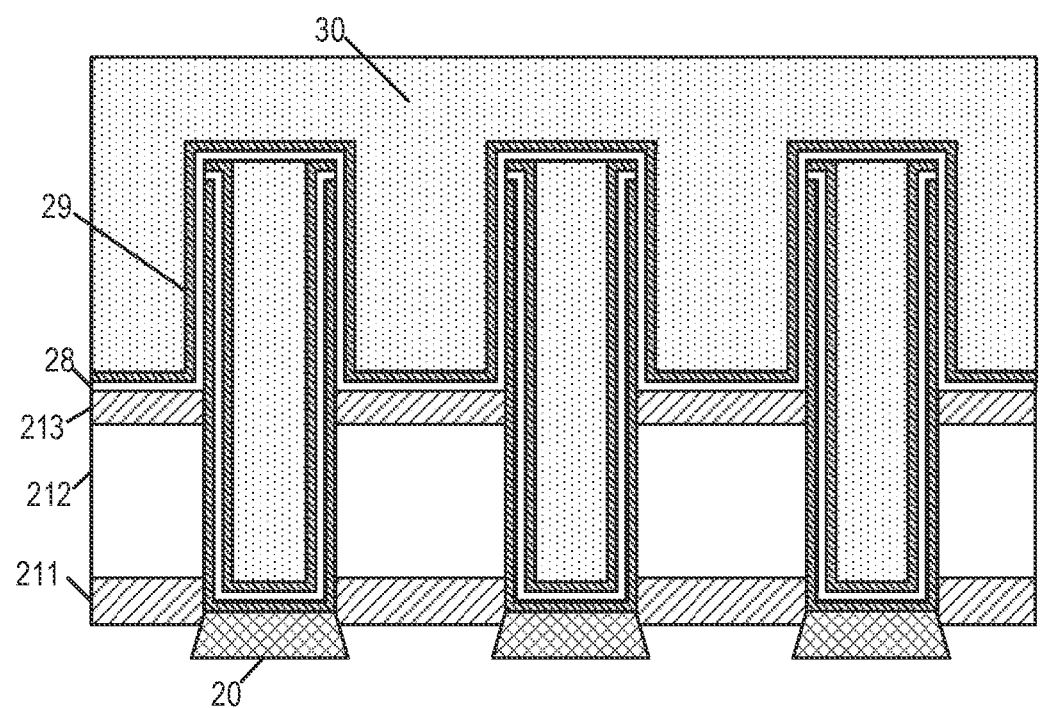

Optionally, after the double-sided capacitor structure is formed, the method further includes the following steps:

a second conductive material is deposited on the surface of the third electrode layer 29 to form a second conductive filling layer 30, as shown in FIG. 2I.

Specifically, after the third supporting layer 215 and the second sacrificial layer 214 are removed, the first electrode layer 23, the first dielectric layer 24, and the second electrode layer 25 extend out of the second supporting layer 213 in the direction perpendicular to the substrate, thereby forming a gap that exposes the second supporting layer 213 between adjacent capacitors. The second conductive material is deposited on the surface of the third electrode layer 29, and the second conductive filling layer 30 formed thereby fills the gap and covers the surface of the third electrode layer 29 above the capacitor holes 22.

In addition, a further example provides a double-sided capacitor structure. The double-sided capacitor structure provided by this example may be formed by the method as shown in FIG. 1 and FIG. 2A to FIG. 2I. As shown in FIG. 2I, the double-sided capacitor structure provided by this example includes:

a base, the base includes a substrate, capacitor contacts 20 in the substrate, a stacked structure 21 on a surface of the substrate, and capacitor holes 22 penetrating through the stacked structure 21 and exposing the capacitor contacts 20. The stacked structure 21 includes sacrificial layers and supporting layers which are alternately stacked in a direction perpendicular to the substrate. The number of the supporting layers may be at least two.

a first electrode layer 23 that covers the inner walls of the capacitor holes 22 and extends out of the stacked structure 21 in the direction perpendicular to the substrate;

a first dielectric layer 24 that covers a top surface and a bottom surface of the first electrode layer 23 and a side wall surface of the first electrode layer 23 facing the capacitor holes 22;

a second electrode layer 25 that covers a top surface and a bottom surface of the first dielectric layer 24 and a side wall surface of the first dielectric layer 24 facing the capacitor holes 22;

a first conductive filling layer 26 that is filled in a region enclosed by the second electrode layer 25;

a second dielectric layer 28 that covers the surface of the second electrode layer 25 and the surface of the first conductive filling layer 26; and a third electrode layer 29 that covers the surface of the second dielectric layer 28.

Optionally, the top surface of the first conductive filling layer 26 is flush with the top surface of the second electrode layer 25.

Optionally, the second dielectric layer 28 also covers the surface of the supporting layer as the top layer of the stacked structure 21.

Optionally, the stacked structure 21 includes a first supporting layer 211 on the surface of the substrate, a first sacrificial layer 212 covering the surface of the first supporting layer 211, and a second supporting layer 213 covering the surface of the first sacrificial layer 212;

the second dielectric layer 28 covers the surface of the second supporting layer 213 facing away from the first sacrificial layer 212.

A material of the first supporting layer 211 and a material of the second supporting layer 213 may be the same. For example, both of them are a nitride material. A material of the first sacrificial layer 212 may be an oxide material. The thickness of the first sacrificial layer 212 is greater than the thickness of the first supporting layer 211 and the thickness of the second supporting layer 213.

Optionally, the double-sided capacitor structure further includes:

a second conductive filling layer 30 that covers the surface of the third electrode layer 29.

A material of the first conductive filling layer 26 and a material of the second conductive filling layer 30 may be the same or different. In order to further simplify a manufacturing procedure of the double-sided capacitor structure, optionally, the material of both the first conductive filling layer 26 and the second conductive filling layer 30 is a polycrystalline silicon material.

The height of the first electrode layer 23 extending out of the stacked structure 21 in the direction perpendicular to the substrate can be designed by those skilled in the art according to an actual need. For example, this height can be greater than, equal to or less than the height of the first electrode layer 23 extending into the stacked structure 21.

According to the double-sided capacitor structure and the method for the same provided by the examples, on the one hand, the region enclosed by the second electrode layer in the capacitor hole is filled with the first conductive filling layer to support the first electrode layer and the second electrode layer, which reduces and even avoids the risk of electrode collapse and overturning; and on the other hand, at least two of the supporting layers and the sacrificial layer between the remained supporting layers are remained, which further improves the lateral stability of a capacitor array region and is beneficial to increasing the overall height of the electrode layer, thereby further increasing the capacitance value of the capacitor.

The above descriptions are only the preferred examples of the present application. It should be noted that those of ordinary skill in the art can further make improvements and modifications without departing from the principles of the present application. These improvements and modifications should be construed as falling into the protection scope of the present application.

The invention claimed is:

1. A method for forming a double-sided capacitor structure, comprising:

providing a base, wherein the base comprises a substrate, capacitor contacts in the substrate, a stacked structure on a surface of the substrate, and capacitor holes penetrating through the stacked structure and exposing the capacitor contacts, and the stacked structure comprises sacrificial layers and supporting layers which are alternately stacked in a direction perpendicular to the substrate;

forming a first electrode layer, a first dielectric layer and a second electrode layer on inner walls of the capacitor holes which are stacked in a radial direction of the capacitor holes in sequence;

filling the capacitor holes with a first conductive material to form a first conductive filling layer;

completely removing several of the sacrificial layers and/or the supporting layers from a top surface of the stacked structure to remain at least two of the supporting layers and at least one of the sacrificial layers located between the at least two of the supporting layers; and forming a second dielectric layer that covers a surface of the second electrode layer and a top surface of the first conductive filling layer, and a third electrode layer that covers a surface of the second dielectric layer, to form the double-sided capacitor structure, wherein the filling the capacitor holes with a first conductive material comprises:

depositing the first conductive material in the capacitor holes and on the top surface of the stacked structure; and removing the first conductive material on the top surface of the stacked structure.

2. The method according to claim 1, wherein the stacked structure comprises a first supporting layer, a first sacrificial layer, a second supporting layer, a second sacrificial layer, and a third supporting layer which are stacked in sequence in the direction perpendicular to the substrate; the completely removing several of the sacrificial layers and/or the supporting layers from a top surface of the stacked structure comprises:

removing the second electrode layer, the first dielectric layer and the first electrode layer that cover the top surface of the stacked structure to expose the third supporting layer;

removing the third supporting layer to expose the second sacrificial layer; and removing the second sacrificial layer.

3. The method according to claim 2, wherein the forming a second dielectric layer that covers a surface of the second electrode layer and a top surface of the first conductive filling layer, and a third electrode layer that covers a surface of the second dielectric layer comprises:

forming the second dielectric layer that covers the surface of the second electrode layer and the top surface of the first conductive filling layer and an exposed surface of the second supporting layer, and the third electrode layer that covers the surface of the second dielectric layer.

4. The method according to claim 3, wherein after the double-sided capacitor structure is formed, the method further comprises:

depositing a second conductive material on a surface of the third electrode layer to form a second conductive filling layer.

5. The method according to claim 4, wherein both the first conductive material and the second conductive material are a polycrystalline silicon material.

6. A double-sided capacitor structure, comprising:

a base, wherein the base comprises a substrate, capacitor contacts in the substrate, a stacked structure on a surface of the substrate, and capacitor holes penetrating through the stacked structure and exposing the capacitor contacts, and the stacked structure comprises at least two supporting layers and at least one sacrificial layers located between the at least two supporting layers which are alternately stacked in a direction perpendicular to the substrate;

a first electrode layer that covers inner walls of the capacitor holes and extends out of the stacked structure in the direction perpendicular to the substrate;

a first dielectric layer that covers a top surface and a bottom surface of the first electrode layer and a side wall surface of the first electrode layer facing the capacitor holes;

a second electrode layer that covers a top surface and a bottom surface of the first dielectric layer and a side wall surface of the first dielectric layer facing the capacitor holes;

a first conductive filling layer that is filled in a region enclosed by the second electrode layer;

a second dielectric layer that covers a surface of the second electrode layer and a surface of the first conductive filling layer; and a third electrode layer that covers a surface of the second dielectric layer, wherein a top surface of the first conductive filling layer is flush with a top surface of the second electrode layer.

7. The structure according to claim 6, wherein the second dielectric layer further covers a surface of the supporting layer as a top layer of the stacked structure.

8. The structure according to claim 7, wherein the stacked structure comprises a first supporting layer on the surface of the substrate, a first sacrificial layer covering a surface of the first supporting layer, and a second supporting layer covering a surface of the first sacrificial layer;

the second dielectric layer covers a surface of the second supporting layer facing away from the first sacrificial layer.

9. The structure according to claim 6, further comprising:

a second conductive filling layer that covers a surface of the third electrode layer.

10. The structure according to claim 9, wherein a material of both the first conductive filling layer and the second conductive filling layer is a polycrystalline silicon material.

11. A double-sided capacitor structure, comprising:

a base, wherein the base comprises a substrate, capacitor contacts in the substrate, a stacked structure on a surface of the substrate, and capacitor holes penetrating through the stacked structure and exposing the capacitor contacts, and the stacked structure comprises at least two supporting layers and at least one sacrificial layers located between the at least two supporting layers which are alternately stacked in a direction perpendicular to the substrate;

a first electrode layer that covers inner walls of the capacitor holes and extends out of the stacked structure in the direction perpendicular to the substrate;

a first dielectric layer that covers a top surface and a bottom surface of the first electrode layer and a side wall surface of the first electrode layer facing the capacitor holes;

a second electrode layer that covers a top surface and a bottom surface of the first dielectric layer and a side wall surface of the first dielectric layer facing the capacitor holes;

a first conductive filling layer that is filled in a region enclosed by the second electrode layer;

a second dielectric layer that covers a surface of the second electrode layer and a surface of the first conductive filling layer;

a third electrode layer that covers a surface of the second dielectric layer; and a second conductive filling layer that covers a surface of the third electrode layer.

12. The structure according to claim 11, wherein a material of both the first conductive filling layer and the second conductive filling layer is a polycrystalline silicon material.

* * * * *